United States Patent
Murata et al.

(10) Patent No.: US 9,227,260 B2
(45) Date of Patent: Jan. 5, 2016

(54) HIGH-SPEED TRANSPORTATION MECHANISM FOR MICRO SOLDER BALLS

(71) Applicant: HGST Netherlands B.V., Amsterdam (NL)

(72) Inventors: Kenichi Murata, Ebina (JP); Yusuke Matsumoto, Fujisawa (JP)

(73) Assignee: HGST NETHERLANDS B.V., Amsterdam (NL)

( * ) Notice: Subject to any disclaimer, the term of this patent is extended or adjusted under 35 U.S.C. 154(b) by 305 days.

(21) Appl. No.: 13/767,023

(22) Filed: Feb. 14, 2013

(65) Prior Publication Data

US 2014/0224773 A1    Aug. 14, 2014

(51) Int. Cl.
*B23K 3/06*    (2006.01)
*B23K 1/005*    (2006.01)
*H05K 3/34*    (2006.01)

(52) U.S. Cl.
CPC ............ *B23K 3/0607* (2013.01); *B23K 3/0623* (2013.01); *H05K 3/3478* (2013.01); *H05K 2203/041* (2013.01)

(58) Field of Classification Search
CPC .... B23K 1/0056; B23K 1/005; B23K 1/0053; B23K 3/0607; B23K 3/0623; H05K 3/3478; H05K 2203/041
See application file for complete search history.

(56) References Cited

U.S. PATENT DOCUMENTS

| | | | |
|---|---|---|---|
| 5,219,117 A | 6/1993 | Lin | |
| 5,977,512 A | 11/1999 | Azdasht et al. | |
| 6,152,348 A * | 11/2000 | Finn et al. | 228/33 |
| 6,336,581 B1 * | 1/2002 | Tuchiya et al. | 228/245 |
| 6,427,903 B1 | 8/2002 | Foulke et al. | |
| 6,543,677 B2 | 4/2003 | Pattanaik et al. | |
| 6,634,545 B2 * | 10/2003 | Razon et al. | 228/246 |
| 7,021,517 B2 * | 4/2006 | Zakel et al. | 228/41 |
| 7,121,449 B2 * | 10/2006 | Zakel et al. | 228/246 |
| 7,164,097 B2 | 1/2007 | Shindo et al. | |
| 7,265,315 B2 | 9/2007 | Oohashi et al. | |
| 8,013,271 B2 | 9/2011 | Fukaya et al. | |
| 2002/0060882 A1 * | 5/2002 | Kidachi et al. | 360/244.2 |

(Continued)

FOREIGN PATENT DOCUMENTS

| | | |
|---|---|---|
| JP | 2006-303279 | 11/2006 |
| JP | 2006-305625 | 11/2006 |
| JP | 2008-142775 A * | 6/2008 |

OTHER PUBLICATIONS

Thomas Oppert et al., "Placement and reflow of solder balls for FC, BGA, Wafer-Level-CSP, Optoelectronic Components and MEMS by using a new solder jetting method", Jun. 26, 2002, pactech.com, Pac Tech-Packaging Technologies GmbH, pp. 1-6.

*Primary Examiner* — Geoffrey S Evans
(74) *Attorney, Agent, or Firm* — John D. Henkhaus

(57) ABSTRACT

Approaches to a solder ball bonding (SBB) tool and a method for solder ball bonding work pieces. The SBB tool comprises a rotatable feed plate for transporting solder balls from a reservoir to a nozzle, which is a position at which a laser light source can irradiate and melt the solder balls. The melted solder ball is then ejected from the nozzle and onto one or more work pieces, for electrically interconnecting the work pieces. The feed plate is configured with first holes and second holes, the first holes for receiving and transporting solder balls and the second holes for providing an aperture for the laser light to irradiate the solder balls, as the feed plate rotates and the holes are moved to positions in relation to the reservoir and the nozzle.

15 Claims, 6 Drawing Sheets

(56) References Cited

U.S. PATENT DOCUMENTS

| | | | |
|---|---|---|---|
| 2004/0011852 A1* | 1/2004 | Uebel et al. | 228/41 |
| 2005/0031776 A1* | 2/2005 | Zakel et al. | 427/123 |
| 2005/0067395 A1* | 3/2005 | Shindo et al. | 219/121.85 |
| 2006/0237514 A1* | 10/2006 | Wagou et al. | 228/37 |
| 2007/0068994 A1 | 3/2007 | Toba | |
| 2008/0179298 A1* | 7/2008 | Nakayama et al. | 219/85.13 |
| 2012/0097734 A1 | 4/2012 | Diep | |
| 2013/0161510 A1* | 6/2013 | O'Connor et al. | 250/492.1 |

* cited by examiner

HIGH-SPEED TRANSPORTATION MECHANISM FOR MICRO SOLDER BALLS

FIELD OF THE INVENTION

Embodiments of the invention relate to a high speed transportation mechanism for a micro solder ball soldering device.

BACKGROUND

A hard-disk drive (HDD) is a non-volatile storage device that is housed in a protective enclosure and stores digitally encoded data on one or more circular disks having magnetic surfaces (a disk may also be referred to as a platter). When an HDD is in operation, each magnetic-recording disk is rapidly rotated by a spindle system. Data is read from and written to a magnetic-recording disk using a read/write head which is positioned over a specific location of a disk by an actuator.

A read/write head uses a magnetic field to read data from and write data to the surface of a magnetic-recording disk. As a magnetic dipole field decreases rapidly with distance from a magnetic pole, the distance between a read/write head, which is housed in a slider, and the surface of a magnetic-recording disk must be tightly controlled. An actuator relies in part on a suspension's force on the slider and on the aerodynamic characteristics of the slider air bearing surface (ABS) to provide the proper distance between the read/write head and the surface of the magnetic-recording disk (the "flying height") while the magnetic-recording disk rotates. A slider therefore is said to "fly" over the surface of the magnetic-recording disk.

An HDD includes at least one head gimbal assembly (HGA) that includes a read/write head, a lead suspension attached to the head, and a load beam attached to the slider, which includes the head at a distal end of the slider. The slider is attached at the distal end of the load beam to a gimbal portion of the load beam. Typically, the slider is electrically interconnected to the lead suspension via connection pads on the respective components, which are solder ball bonded (SBB) together to form the final electrical interconnection between the components.

One SBB method places a solder ball between the connection pad of the slider and the connection pad of the suspension, reflows the solder ball by using laser light, and electrically interconnects the connection pad of the slider and the connection pad of the suspension. To prevent oxidation of the solder surface, the solder ball is reflowed in an inert gas environment such as nitrogen. The device for feeding and ejecting the solder ball by a compressed gas, such as nitrogen gas, is typically referred to as a solder ball jet (SB-jet).

The solder ball must be accurately placed between the pads in order to reflow the solder ball with the laser light. However, the head slider is an extremely small component, and its size continues to decrease with successive designs. Therefore, the connection pads and the solder balls placed at the pads are also becoming smaller, and placing the solder balls at the exact positions becomes more challenging. In addition, the solder ball often rotates during reflow. Thus, the placements of the solder balls frequently require correction, which becomes a source of degradation in the efficiency of the manufacturing process.

FIG. 3 is a diagram illustrating a solder ball jet of a prior art solder ball bonding tool. In the SB jet 300 illustrated in FIG. 3, pressure is applied to a solder ball by a compressed gas as the solder ball is falling to a nozzle 302 or after the solder ball is held at the tip of the nozzle 302, and laser light from laser 308 irradiates the solder ball through the path of laser optical path 304 to eject melted solder. When the solder ball supply into nozzle 302 is through the inclined solder ball feed path 306, supplying the solder ball takes time and, consequently, the takt time becomes long.

SUMMARY OF EMBODIMENTS OF THE INVENTION

Embodiments of the invention are directed at a solder ball bonding (SBB) tool and a method for solder ball bonding work pieces, such as components of a head gimbal assembly (HGA) of a hard-disk drive (HDD). The SBB tool comprises a rotatable feed plate for transporting solder balls from a reservoir to a nozzle unit, which is a position at which a laser light source can irradiate and thus melt the solder balls. The melted solder ball is then able to be ejected from a nozzle and onto one or more work pieces, for electrically interconnecting the work pieces.

In embodiments, the feed plate is configured with alternating first and second holes, where the first holes are for receiving and transporting solder balls and the second holes are for providing an aperture for the laser light to irradiate the solder balls, as the feed plate rotates and the holes are moved to positions in relation to the reservoir and the nozzle unit. With use of these two types of holes, the solder ball can be directly supplied into the solder ball jet nozzle, and laser light can irradiate the solder ball. The described mechanism and process shortens the solder ball feed path in comparison with prior designs, which consequently lowers the takt time for the solder ball bonding process.

Embodiments discussed in the Summary of Embodiments of the Invention section are not meant to suggest, describe, or teach all the embodiments discussed herein. Thus, embodiments of the invention may contain additional or different features than those discussed in this section.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION

Approaches to a solder ball bonding (SBB) tool and a method for solder ball bonding work pieces, such as components of a head gimbal assembly (HGA) of a hard-disk drive (HDD), are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

Physical Description of Illustrative Embodiments of the Invention

Embodiments of the invention may be used to, but are not limited to, solder ball bonding components of a head gimbal assembly (HGA) of a hard-disk drive (HDD) storage device. For example, embodiments may be used to bond slider connection pads to integrated lead suspension (ILS) connection pads, in the manufacturing process of a HDD.

Figure 1:
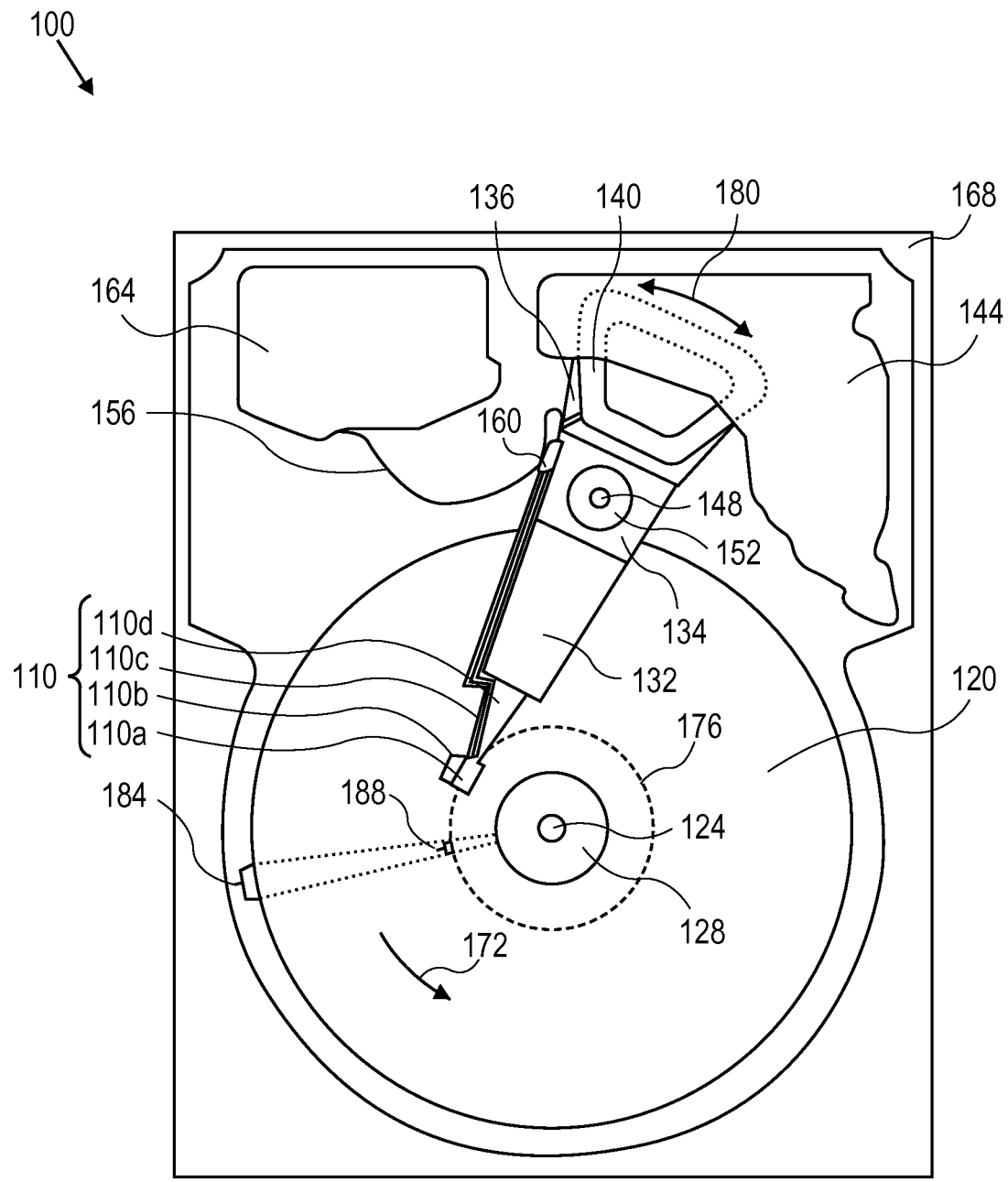
FIG. 1 is a plan view of an HDD, according to an embodiment of the invention.

FIG. 1 is a plan view of an HDD according to an embodiment of the invention. FIG. 1 illustrates the functional arrangement of components of the HDD including a slider 110b that includes a magnetic-reading/recording head 110a. Collectively, slider 110b and head 110a may be referred to as a head slider. The HDD 100 includes at least one head gimbal assembly (HGA) 110 including the head 110a, a lead suspension 110c attached to the head 110a, and a load beam 110d attached to the slider 110b, which includes the head 110a at a distal end of the slider 110b; the slider 110b is attached at the distal end of the load beam 110d to a gimbal portion of the load beam 110d. The HDD 100 also includes at least one magnetic-recording disk 120 rotatably mounted on a spindle 124 and a drive motor (not shown) attached to the spindle 124 for rotating the disk 120.

The head 110a includes a write element and a read element for respectively writing and reading information stored on the disk 120 of the HDD 100. The disk 120 or a plurality (not shown) of disks may be affixed to the spindle 124 with a disk clamp 128. The HDD 100 further includes an arm 132 attached to the HGA 110, a carriage 134, a voice-coil motor (VCM) that includes an armature 136 including a voice coil 140 attached to the carriage 134; and a stator 144 including a voice-coil magnet (not shown). The armature 136 of the VCM is attached to the carriage 134 and is configured to move the arm 132 and the HGA 110 to access portions of the disk 120 being mounted on a pivot-shaft 148 with an interposed pivot-bearing assembly 152.

With further reference to FIG. 1, in accordance with an embodiment of the present invention, electrical signals, for example, current to the voice coil 140 of the VCM, write signal to and read signal from the head 110a, are provided by a flexible cable 156. Interconnection between the flexible cable 156 and the head 110a may be provided by an arm-electronics (AE) module 160, which may have an on-board pre-amplifier for the read signal, as well as other read-channel and write-channel electronic components. The flexible cable 156 is coupled to an electrical-connector block 164, which provides electrical communication through electrical feedthroughs (not shown) provided by an HDD housing 168. The HDD housing 168, also referred to as a casting, depending upon whether the HDD housing is cast, in conjunction with an HDD cover (not shown) provides a sealed, protective enclosure for the information storage components of the HDD 100.

With further reference to FIG. 1, in accordance with an embodiment of the present invention, other electronic components (not shown), including a disk controller and servo electronics including a digital-signal processor (DSP), provide electrical signals to the drive motor, the voice coil 140 of the VCM and the head 110a of the HGA 110. The electrical signal provided to the drive motor enables the drive motor to spin providing a torque to the spindle 124 which is in turn transmitted to the disk 120 that is affixed to the spindle 124 by the disk clamp 128; as a result, the disk 120 spins in a direction 172. The spinning disk 120 creates a cushion of air that acts as an air-bearing on which the air-bearing surface (ABS) of the slider 110b rides so that the slider 110b flies above the surface of the disk 120 without making contact with a thin magnetic-recording medium of the disk 120 in which information is recorded. The electrical signal provided to the voice coil 140 of the VCM enables the head 110a of the HGA 110 to access a track 176 on which information is recorded. Thus, the armature 136 of the VCM swings through an arc 180 which enables the HGA 110 attached to the armature 136 by the arm 132 to access various tracks on the disk 120. Information is stored on the disk 120 in a plurality of concentric tracks (not shown) arranged in sectors on the disk 120, for example, sector 184.

Correspondingly, each track is composed of a plurality of sectored track portions, for example, sectored track portion 188. Each sectored track portion 188 is composed of recorded data and a header containing a servo-burst-signal pattern, for example, an ABCD-servo-burst-signal pattern, information that identifies the track 176, and error correction code information. In accessing the track 176, the read element of the head 110a of the HGA 110 reads the servo-burst-signal pattern which provides a position-error-signal (PES) to the servo electronics, which controls the electrical signal provided to the voice coil 140 of the VCM, enabling the head 110a to follow the track 176. Upon finding the track 176 and identifying a particular sectored track portion 188, the head 110a either reads data from the track 176 or writes data to the track 176 depending on instructions received by the disk controller from an external agent, for example, a microprocessor of a computer system.

Embodiments of the invention also encompass HDD 100 that includes the HGA 110, the disk 120 rotatably mounted on the spindle 124, the arm 132 attached to the HGA 110 including the slider 110b including the head 110a.

Figure 2:
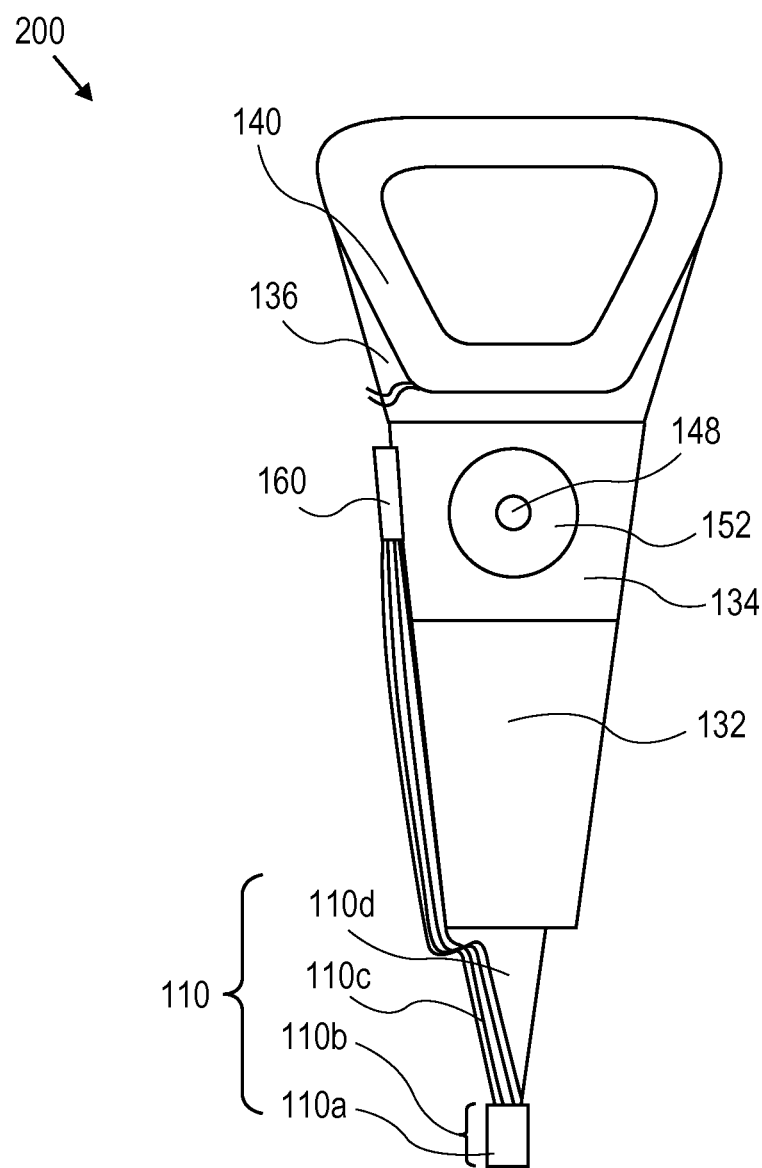
FIG. 2 is a plan view of a head-arm-assembly (HAA), according to an embodiment of the invention.

FIG. 2 is a plan view of a head-arm-assembly (HAA), according to an embodiment of the invention. FIG. 2 illustrates the functional arrangement of the HAA with respect to the HGA 110. The HAA includes the arm 132 and HGA 110 including the slider 110b including the head 110a. The HAA is attached at the arm 132 to the carriage 134. In the case of an HDD having multiple disks, or platters as disks are sometimes referred to in the art, the carriage 134 is called an "E-block," or comb, because the carriage is arranged to carry a ganged array of arms that gives it the appearance of a comb. As shown in FIG. 2, the armature 136 of the VCM is attached to the carriage 134 and the voice coil 140 is attached to the armature 136. The AE 160 may be attached to the carriage 134 as shown. The carriage 134 is mounted on the pivot-shaft 148 with the interposed pivot-bearing assembly 152.

Introduction

Even though takt time, or cycle time, is an important metric and constraint in mass production processes such as HDD manufacturing, sub-optimum processes and tools are commonly used. Therefore, any improvements to manufacturing tools and/or processes, which decrease the takt time, are welcome improvements.

Figure 3:
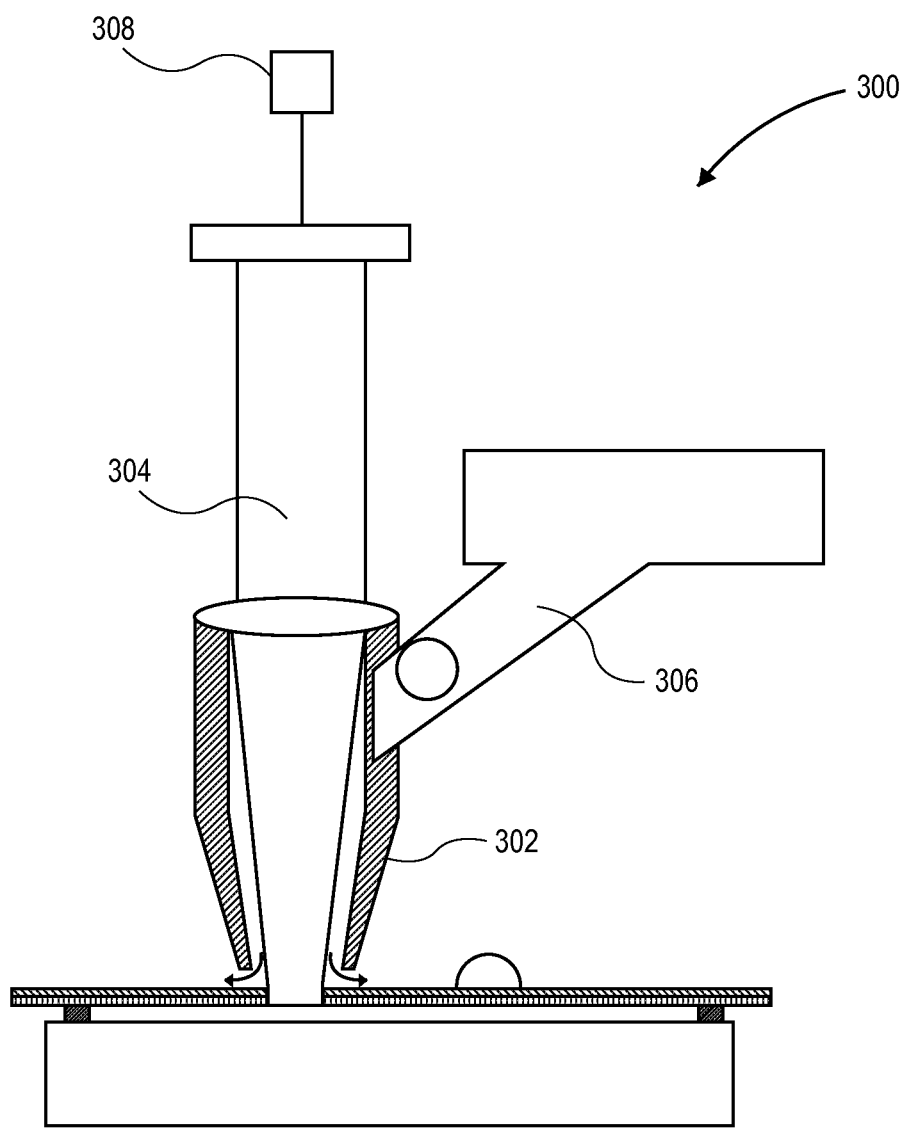
FIG. 3 is a diagram illustrating a solder ball jet of a prior art solder ball bonding tool.

As mentioned in the Background section, in known SBB tools, when the solder ball supply into nozzle 302 (FIG. 3) is through the inclined solder ball feed path 306 (FIG. 3), supplying the solder ball takes a certain amount of time and thus the takt time is longer than desired. Directly supplying solder balls into the solder ball jet nozzle, using the mechanisms and processes of the present embodiments, shortens the solder ball feed path in comparison with prior designs, which consequently lowers the takt time for the solder ball bonding process. As a non-limiting example, experiments comparing embodiments of the invention with conventional solder ball bonding tools and techniques have shown an over 40% reduction in solder ball bonding takt times.

Multi-Hole Feed Plate for Solder Ball Bonding Tool

Figure 4A:
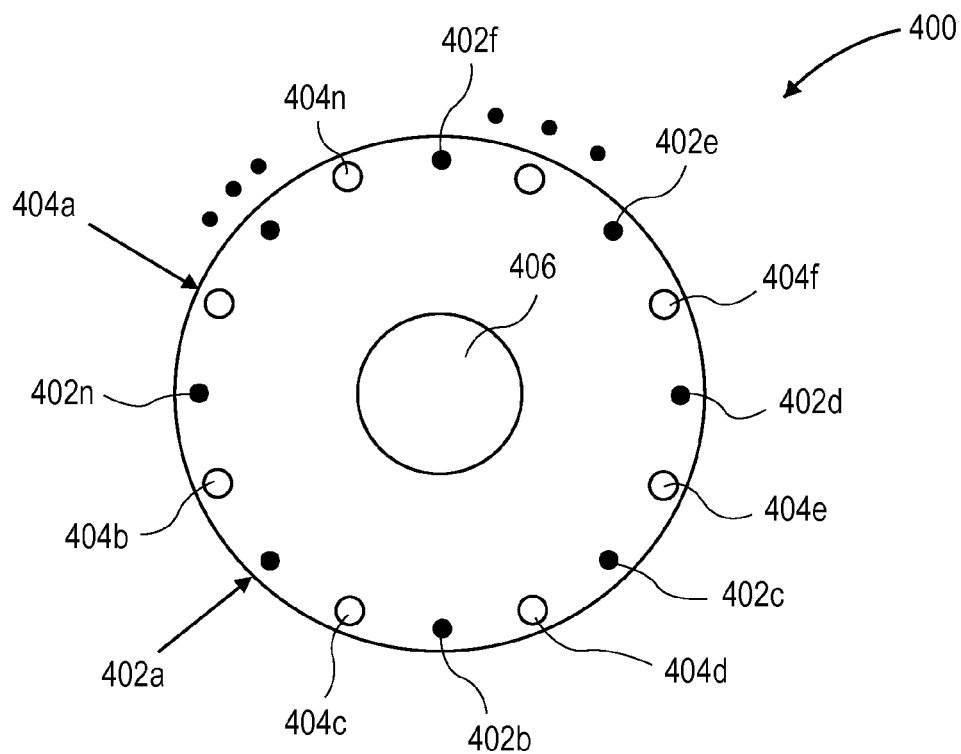
FIG. 4A is a plan view of a multi-hole feed plate portion of a solder ball bonding tool, according to an embodiment of the invention.

FIG. 4A is a plan view of a multi-hole feed plate portion of a solder ball bonding tool, according to an embodiment of the invention. Feed plate 400 illustrated in FIG. 4A comprises a central shaft 406 for rotating the plate, and a plurality of solder ball holes 402a, 402b, 402c, 402d, 402e, 402f, 402n (collectively, 402a-402n), where the letter n, and thus the number of solder ball holes 402, may vary from implementation to implementation. Feed plate 400 further comprises a plurality of laser holes 404a, 404b, 404c, 404d, 404e, 404f, 404n (collectively, 404a-404n), where the letter n, and thus the number of laser holes 404, may vary from implementation to implementation. According to an embodiment, feed plate 400 is configured such that solder ball holes 402a-402n alternate with laser holes 404a-404n, as illustrated in FIG. 4A. Alternating solder ball holes 402a-402n and laser holes 404a-404n may be configured equidistant from each adjacent hole, but need not be, as the exact configuration of solder ball holes 402a-402n and laser holes 404a-404n may vary from implementation to implementation.

Figure 4B:
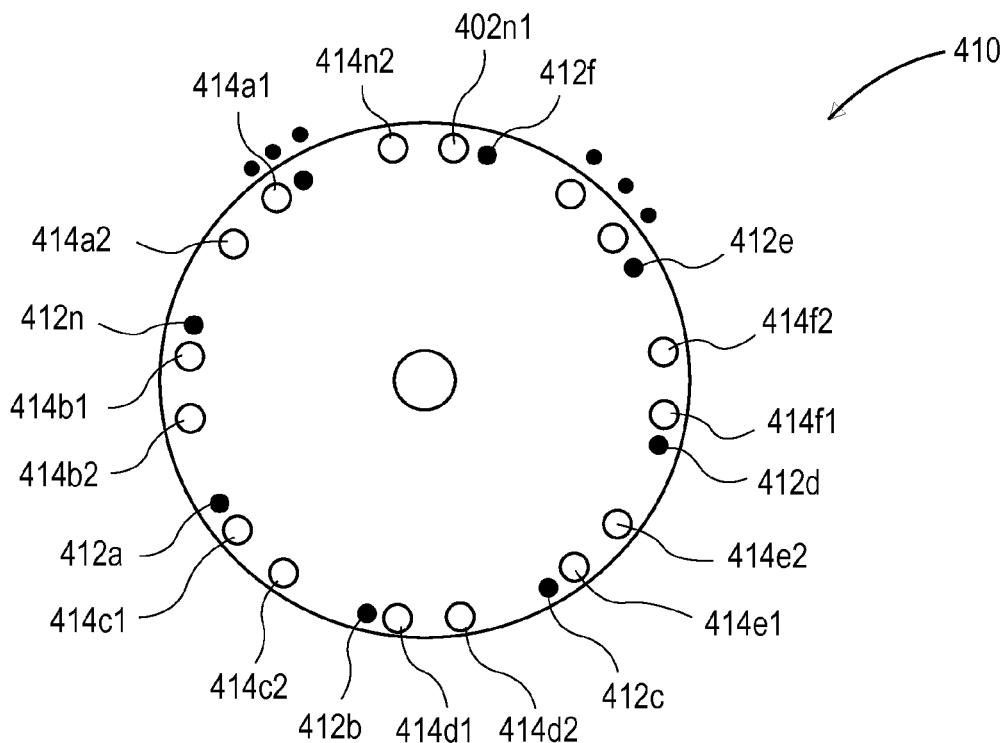
FIG. 4B is a plan view of a multi-hole feed plate portion of a solder ball bonding tool, according to an embodiment of the invention.

Furthermore, feed plate 400 may be configured with solder ball holes and laser holes that are not alternating, for example, if a solder ball bonding tool and corresponding method of use would benefit from a non-alternating hole pattern. FIG. 4B is a plan view of a multi-hole feed plate portion of a solder ball bonding tool, according to an embodiment of the invention. Feed plate 410 illustrated in FIG. 4B comprises a plurality of solder ball holes 412a, 412b, 412c, 412d, 412e, 412f, 412n (collectively, 412a-412n), where the letter n, and thus the number of solder ball holes 412, may vary from implementation to implementation. Feed plate 410 further comprises a plurality of laser hole pairs 414a1 and 414a2, 414b1 and 414b2, 414c1 and 414c2, 414d1 and 414d2, 414e1 and 414e2, 414f1 and 414f2, 414n1 and 414n2 (collectively, 414a1 and 414a2-414n1 and 414n2), where the letter n, and thus the number of laser holes 414, may vary from implementation to implementation. For non-limiting examples, a solder ball bonding tool may need multiple laser shots to fully bond together work pieces, or may be configured to apply a first shot of ultraviolet light through a first laser hole to remove contamination on a soldering target and then apply a second shot of laser through an adjacent second laser hole to bond together the work pieces.

Figure 5A:
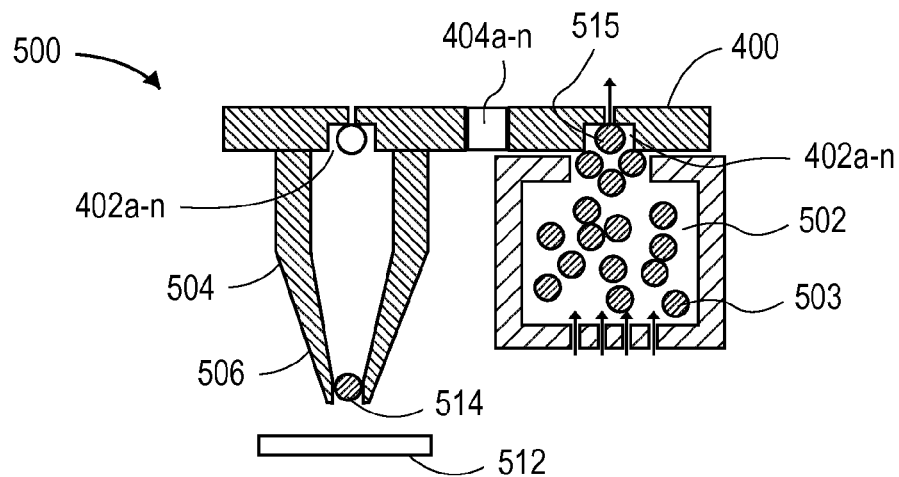
FIG. 5A, FIG. 5B, and FIG. 5C are diagrams illustrating a solder ball jet process using a multi-hole feed plate of a solder ball bonding tool, according to an embodiment of the invention.
Figure 5B:
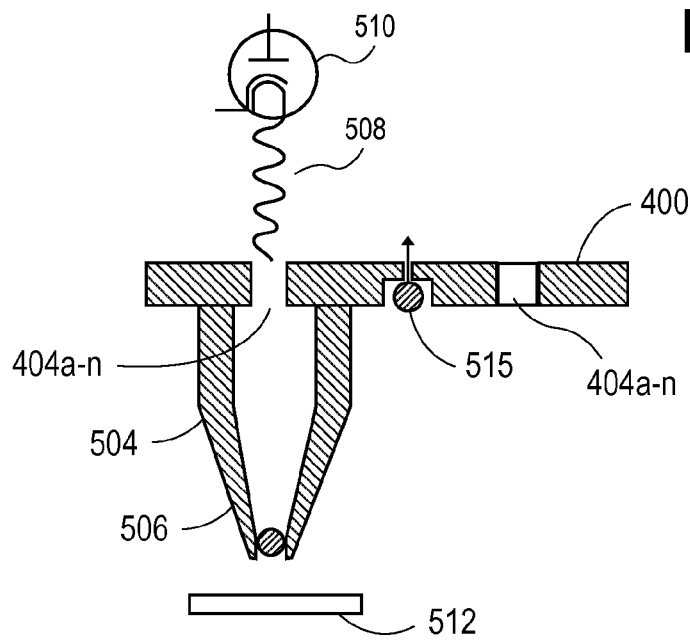
Figure 5C:
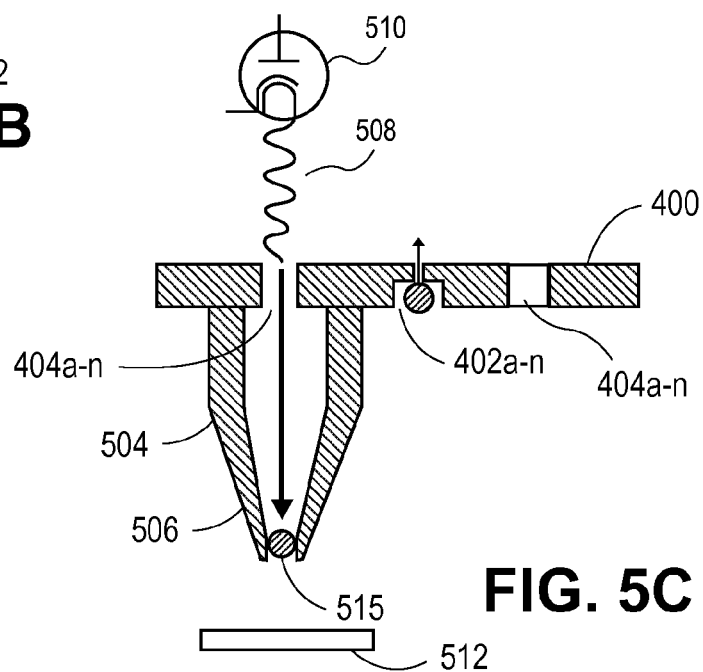

FIG. 5A, FIG. 5B, and FIG. 5C are diagrams illustrating a solder ball jet process using a multi-hole feed plate of a solder ball bonding tool, according to an embodiment of the invention. The main components of an SBB tool 500 comprise a solder ball reservoir 502, a nozzle unit 504, a nozzle 506, a laser light source 510, and feed plate 400 (FIG. 4A).

The solder ball reservoir 502 is configured for housing a plurality of solder balls 503. The nozzle unit 504 is configured for directing a solder ball into a nozzle 506 and for facilitating the ejection of the solder ball from the nozzle 506 onto one or more work piece 512, using a pressurized gas. The laser light source 510 is configured for irradiating, with laser light 508, a solder ball 514 residing in nozzle 506. Irradiating solder ball 514 with the laser light 508 causes solder ball 514 to melt, or at least begin to melt or partially melt, so that the melted solder ball 514 can be ejected from nozzle 506 onto the one or more work piece 512.

Returning to FIG. 4A, feed plate 400 is configured in a SBB tool (e.g., SBB tool 500 of FIGS. 5A-5C) such that feed plate 400 rotates so that the solder ball holes 402a-402n and the laser holes 404a-404n rotate past (e.g., over, or possibly implemented under) the solder ball reservoir 502 (FIG. 5A) and the nozzle unit 504 (FIGS. 5A-5C). Solder ball holes 402a-402n are configured for receiving solder balls 503 from solder ball reservoir 502 as each solder ball hole 402a-402n rotates past the reservoir 502.

According to an embodiment, each solder ball hole 402a-402n comprises two coaxial holes of different diameters. One of the coaxial holes has a slightly larger diameter than the solder balls so that a solder ball such as solder ball 515 (FIG. 5A) can fit into the hole. The other coaxial hole has a small diameter which is smaller than the other coaxial hole and smaller than the diameter of the solder balls 503 (FIG. 5A). Thus, as the feed plate 400 rotates and a solder ball hole 402a-402n is positioned over the solder ball reservoir 502 (FIG. 5A), compressed gas is blown through the reservoir 502 (e.g., from below the reservoir 502) to create suction and thus force solder ball 515 into the solder ball hole 402a-402n positioned above the reservoir, as depicted in FIG. 5A. The smaller diameter portion of the solder ball hole 402a-402n enables the creation of the suction from the compressed gas. Further, the smaller diameter portion of the solder ball hole 402a-402n enables the solder ball 515 to be housed within the solder ball hole 402a-402n because the diameter of the smaller hole is less than the diameter of a solder ball and, therefore, the solder ball cannot be blown or sucked through the smaller diameter hole portion.

FIG. 5B illustrates the feed plate 400 rotated to a position past its position in FIG. 5A. As such, the solder ball hole 402a-402n is no longer above the solder ball reservoir 502 (FIG. 5A) and is rotating toward a position over the nozzle unit 504. As the feed plate 400 is rotating from a position over the solder ball reservoir 502 to a position over the nozzle unit 504, a suction force is continuously applied to the solder ball 515 so that solder ball 515 remains housed in the solder ball hole 402a-402n.

FIG. 5C illustrates the feed plate 400 rotated to a position past its position in FIG. 5B. As such, the subject solder ball hole 402a-402n has now rotated past the nozzle unit 504 and has ejected solder ball 515 into the nozzle 506 of nozzle unit 504. Solder ball 515 can be ejected into the nozzle 506 via gravity or via a compressed gas. At this stage of the process, a laser hole 404a-404n is now positioned over the nozzle unit 504 such that laser light source 510 (FIG. 5C) can irradiate and melt the solder ball 515 currently positioned in nozzle 506, with laser light 508. Laser holes 404a-404n function as an aperture through which the laser light 508 produced by laser light source 510 is incident upon the solder ball 515. Once the solder ball 515 has been melted by the laser light 508, the melted solder ball 515 is ejected onto one or more work piece 512, typically by a compressed inert gas such as nitrogen gas.

Interconnecting by solder ball bonding according to an embodiment interconnects the connection pads of the head slider (e.g., slider 110b and head 110a of FIG. 1) to the connection pads on the gimbal or suspension. In an HGA having a micro actuator, the connection pads of the head slider and the connection pads of the micro actuator, or the connection pads of the micro actuator and the connection pads of the gimbal/suspension, are also interconnected. However, use of the described embodiments of the invention are not limited to use for manufacturing an HGA or an HDD. Rather, embodiments may be implemented for use in any micro solder ball bonding process.

A Method for Solder Ball Bonding Work Pieces

Figure 6:
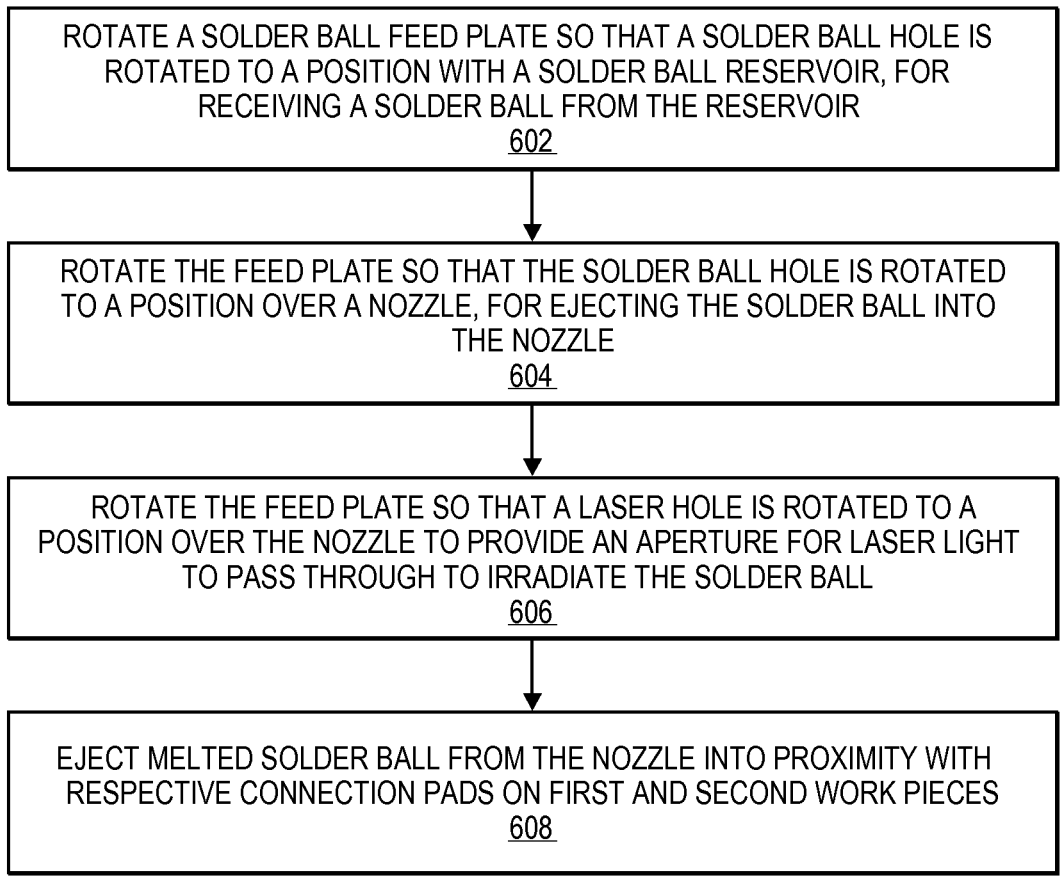
FIG. 6 is a flow diagram illustrating a method for solder ball bonding two work pieces using a rotatable feed plate, according to an embodiment of the invention.

FIG. 6 is a flow diagram illustrating a method for solder ball bonding two work pieces using a rotatable feed plate, according to an embodiment of the invention. The method depicted in FIG. 6 may be implemented for use with the feed plate 400 of FIG. 4A.

At block 602, a solder ball feed plate is rotated so that a solder ball hole is rotated to a position with a solder ball reservoir for receiving a solder ball from the reservoir. For example, solder ball feed plate 400 (FIG. 4A) of a SBB tool is rotated so that one of the solder ball holes 402a-402n is over the solder ball reservoir 502 (FIG. 5A) so that solder ball 515 (FIG. 5A) can be suctioned into and housed in the particular solder ball hole.

At block 604, the solder ball feed plate is rotated so that a solder ball hole is rotated to a position over a nozzle for ejecting the solder ball into the nozzle. For example, solder ball feed plate 400 (FIG. 4A) is rotated so that one of the solder ball holes 402a-402n is over the nozzle unit 504 (FIG. 5A) so that solder ball 515 (FIG. 5A) can be ejected through nozzle unit 504 into the nozzle 506 (FIG. 5A).

At block 606, the solder ball feed plate is rotated so that a laser hole is rotated to a position over the nozzle to provide an aperture for laser light to irradiate the solder ball residing in the nozzle. For example, solder ball feed plate 400 (FIG. 4A) is rotated so that one of the laser holes 404a-404n is over the nozzle unit 504 (FIG. 5C) so that solder ball 515 (FIG. 5C) residing in the nozzle 506 (FIG. 5C) can be irradiated and at least partially melted by laser light 508 (FIG. 5C) from laser light source 510 (FIG. 5C).

According to an embodiment, after rotating the feed plate so that a laser hole is rotated to a position over the nozzle, the nozzle area is pressurized with a pressurized gas. For a non-limiting example, the nozzle area may be pressurized with nitrogen gas. In this embodiment, the solder ball is irradiated after the nozzle area is pressurized.

At block 608, the melted solder ball is ejected from the nozzle into proximity with respective connection pads on first and second work pieces. For example, the melted solder ball 515 (FIG. 5C) residing in the nozzle 506 (FIG. 5C) is ejected from the nozzle 506 out of nozzle unit 504 and onto one or more work piece 512 (FIG. 5C).

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A solder ball bonding (SBB) tool, comprising:
a solder ball reservoir configured for housing solder balls;
a rotatable feed plate comprising a plurality of first holes for receiving a solder ball from said reservoir and for feeding said solder ball into a nozzle unit and a plurality of second holes separate from said plurality of first holes and providing an aperture for guiding laser light from a laser light source onto said solder ball to irradiate said solder ball;
said laser light source for at least partially melting said solder ball; and
said nozzle unit configured for directing a solder ball into a nozzle and ejecting said solder ball from said nozzle onto a work piece.

2. The SBB tool of claim 1, wherein said feed plate is configured to rotate in a manner that said first and second holes pass in rotating relationship with said solder ball reservoir and said nozzle unit.

3. The SBB tool of claim 1,
wherein each said first hole comprises a first diameter hole and a second diameter hole coaxial with said first diameter hole;
wherein said second diameter hole has a larger diameter than said solder ball so that said second diameter hole can house said solder ball while said feed plate is rotating in a manner that said first and second holes pass in rotating relationship with said solder ball reservoir and said nozzle unit; and
wherein said first diameter hole has a smaller diameter than said second diameter hole and said first diameter hole has a smaller diameter than said solder ball so that said first diameter hole enables a suction force to maintain the housing of said solder ball in said second diameter hole.

4. The SBB tool of claim 1, wherein said feed plate is configured to rotate in a manner that:
a first hole is rotated to a position with said solder ball reservoir and receives said solder ball from said reservoir;
said first hole is rotated to a position over said nozzle unit and from which said solder ball is ejected into said nozzle; and
said second hole is rotated to a position over said nozzle unit to provide an aperture for said laser light to irradiate said solder ball.

5. The SBB tool of claim 1, wherein a plurality of second holes are configured alternately with a singular first hole in said rotatable feed plate.

6. The SBB tool of claim 1, wherein said first and second holes are configured alternately in said rotatable feed plate.

7. The SBB tool of claim 6, wherein adjacent first and second holes are configured equidistant in said rotatable feed plate.

8. A method for solder ball bonding a first work piece to a second work piece using a rotatable feed plate, the method comprising:
rotating said feed plate so that a solder ball hole is rotated to a position with a solder ball reservoir, for receiving a solder ball from said reservoir;
rotating said feed plate so that said solder ball hole is rotated to a position over a nozzle, for ejecting said solder ball into said nozzle; and
rotating said feed plate so that a laser hole is rotated to a position over said nozzle to provide an aperture for laser light to pass there through to irradiate said solder ball; and ejecting melted solder from said nozzle into proximity with respective connection pads on said first and second work pieces.

9. The method of claim 8, wherein said solder ball hole is a first solder ball hole, said laser hole is a first laser hole, said solder ball is a first solder ball and said connection pads are first connection pads, the method comprising:
rotating said feed plate so that a second solder ball hole is rotated to a position with said solder ball reservoir, for receiving a second solder ball from said reservoir;
rotating said feed plate so that said second solder ball hole is rotated to a position over said nozzle, for ejecting said second solder ball into said nozzle; and
rotating said feed plate so that a second laser hole is rotated to a position over said nozzle to provide an aperture for laser light to pass there through to irradiate said second solder ball; and
ejecting the melted second solder ball from said nozzle into proximity with respective second connection pads on said first and second work pieces.

10. The method of claim 8, wherein said first work piece is a head slider for a hard disk drive and said second work piece is a suspension for said hard disk drive.

11. The method of claim 8, further comprising:
after rotating said feed plate so that a laser hole is rotated to a position over said nozzle,
pressurizing said nozzle with a pressurized gas; and
irradiating said solder ball.

12. The method of claim 11, wherein pressurizing comprises pressurizing said nozzle with nitrogen gas.

13. A solder ball bonding (SBB) tool, comprising:
a solder ball reservoir configured for housing solder balls;
a rotatable feed plate comprising a plurality of first holes for receiving a solder ball from said reservoir and for feeding said solder ball into a nozzle unit and a plurality of second holes providing an aperture for guiding laser light from a laser light source onto said solder ball to irradiate said solder ball;
said laser light source for at least partially melting said solder ball; and
said nozzle unit configured for directing said solder ball into a nozzle and ejecting said solder ball from said nozzle onto a work piece;
wherein said feed plate is configured to rotate in a manner such that:
a first hole is rotated to a position with said solder ball reservoir such that said first hole receives said solder ball from said reservoir;
said first hole is rotated to a position over said nozzle unit and from which said solder ball is ejected into said nozzle; and
a second hole is rotated to a position over said nozzle unit to provide an aperture for said laser light to irradiate said solder ball.

14. The SBB tool of claim 13, wherein said first holes and said second holes are configured alternately in said rotatable feed plate.

15. The SBB tool of claim 13,
wherein each of said plurality of first holes comprises a first diameter hole and a second diameter hole coaxial with said first diameter hole;
wherein said second diameter hole has a larger diameter than said solder ball so that said second diameter hole can house said solder ball while said feed plate is rotating in a manner that said first and second holes pass in rotating relationship with said solder ball reservoir and said nozzle unit; and
wherein said first diameter hole has a smaller diameter than said second diameter hole and said first diameter hole has a smaller diameter than said solder ball so that said first diameter hole enables a suction force to maintain the housing of said solder ball in said second diameter hole.

* * * * *